(12) United States Patent
Mattisson et al.

(10) Patent No.: US 7,079,590 B2
(45) Date of Patent: *Jul. 18, 2006

(54) DC-OFFSET COMPENSATION

(75) Inventors: Sven Mattisson, Bjärred (SE); Leif Wilhelmsson, Dalby (DE); Peter Markenlöv, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 11/220,034

(22) Filed: Sep. 6, 2005

(65) Prior Publication Data

US 2006/0002492 A1    Jan. 5, 2006

Related U.S. Application Data

(63) Continuation of application No. 09/976,862, filed on Oct. 15, 2001, now Pat. No. 6,950,479.

(60) Provisional application No. 60/241,349, filed on Oct. 19, 2000.

(30) Foreign Application Priority Data

Oct. 16, 2000 (GB) ................... 0025314.6

(51) Int. Cl.
  H04L 3/02 (2006.01)
  H04L 1/00 (2006.01)
  H04J 3/02 (2006.01)
  H03L 5/00 (2006.01)

(52) U.S. Cl. ..................... 375/295; 375/346; 370/462; 327/307

(58) Field of Classification Search ................ 375/295, 375/346; 370/462, 342; 455/296; 702/189; 327/307, 362
See application file for complete search history.

(56) References Cited

U.S. PATENT DOCUMENTS

| 4,339,727 | A | 7/1982 | Kage et al. |
| 4,873,702 | A | 10/1989 | Chiu |
| 5,086,437 | A | 2/1992 | Tomita |
| 5,140,699 | A | 8/1992 | Kozak |
| 5,805,632 | A | 9/1998 | Leger |
| 5,898,912 | A | 4/1999 | Heck et al. |
| 6,104,238 | A | 8/2000 | Mattisson et al. |
| 6,259,315 | B1 | 7/2001 | Mattisson et al. |
| 6,690,740 | B1 | 2/2004 | Mattisson et al. |

FOREIGN PATENT DOCUMENTS

| JP | 11041130 A | 2/1999 |
| JP | 11284678 A | 10/1999 |
| WO | WO 98/0198 A1 | 1/1998 |
| WO | WO 00/11831 A2 | 3/2000 |

*Primary Examiner*—Emmanuel Bayard
*Assistant Examiner*—Lawrence B. Williams
(74) *Attorney, Agent, or Firm*—Potomac Patent Group PLLC

(57) ABSTRACT

A method of estimating a DC offset value of a signal includes estimating a DC offset value of a preamble part of the signal using a pair of diodes (D1, D2) and a resistor (R) connected in parallel. During receipt of the data part of the signal, the diode pair (D1, D2) is switched out of the circuit by a switch (SW). During reception of the data part, the DC level is estimated using a low pass filter (R,C).

4 Claims, 1 Drawing Sheet

DC-OFFSET COMPENSATION

FIELD OF THE INVENTION

The present invention relates to DC-offset compensation. In particular, but not exclusively, the present invention relates to all kinds of communication systems where decisions require knowledge of the DC-offset of a signal. In particular, it applies to detection of frequency modulated (FM) signals in which data is sent in packets preceded by a preamble which is considerably more robust than the data in the payload, and where the preamble is not necessarily DC-free.

BACKGROUND OF THE INVENTION

An ideal FM detector has a linear relationship between the instantaneous frequency deviation and the output of the detector. Moreover, in the ideal case the output of the detector for an un-modulated carrier would be known exactly. Without loss of generality this known value can be considered to be zero. This simply means that a positive frequency deviation will result in a positive output from the FM detector and a negative frequency deviation will result in a negative output (or vice versa). Since binary information is preferably transmitted by mapping a zero to a negative frequency deviation and a one to a positive frequency deviation, a hard decision can then simply be made by considering the sign of the output of the FM detector. If instead soft information was to be used, not only the sign, but also the actual value of the output of the detector would be used. This is also the case if non-binary alphabets were to be employed.

In practice there will be frequency offsets in the received signal, which are due to various imperfections at both the transmitter and the receiver. This means that the output from the FM detector is not zero for an un-modulated carrier, and therefore zero cannot be used as a threshold to make a decision at the output of the FM detector. Thus, a proper choice of threshold has to be found. Since the frequency offset is not known beforehand and typically is not even constant through the reception of a packet, it has to be found and adjusted dynamically. There are several known ways to do this.

If the received data itself is DC-free, the DC-level can be found by integrating/low-pass filtering the received signal.

However, this approach inherently has the property that one has to trade accuracy for settlement time. To overcome this trade-off to some extent, one can use a smaller time-constant during the initial part of the packet to get a rapid but coarse DC-estimate, and then shift to a larger time-constant to obtain a smoother and more accurate DC-estimate once the coarse estimate is considered as completed.

Another known method for estimation of the DC-level is to make use of a circuit which clamps the maximum and the minimum values of the received signal. The average of these two values is then taken as the DC-level. This has the advantage of being very fast because the maxima and the minima of the signal are present at an early stage. For DC-estimation based on max-min, it is essential that the signal does not contain any spikes or similar phenomena, since the max/min detector will react to these. Moreover, since the DC-level may vary during the reception of a packet, the maximum and minimum values have to decay (towards the estimated DC), in order to guarantee that such variations actually can be followed. The rate of this decay will be a trade-off between being able to follow a varying DC-level and having as stable DC estimate as possible.

SUMMARY OF THE INVENTION

In the proposed method, DC estimation is done in two steps. A first, coarse, DC estimation is done during the reception of the preamble preceding the data packet. Some of the key properties of the proposed circuit in this phase is that it is fast, that it does not require the preamble to be DC-free, and that it does not require the presence of the preamble to be known. The first part ends once the presence of a valid preamble is found, and then part two of the DC estimation commences. In this second part of the DC estimation, the fact that the data can be assumed to be essentially DC free (due to the fact that the data is whitened) is exploited by the low-pass filtering the desired signal and in this way obtain the DC estimate. Both the first and the second step of DC estimation have the ability to follow variations of the DC level throughout the preamble and the actual data packet, respectively.

The present invention makes use of highly non-linear processing in the initial part, the so-called preamble, of the data packet. In this way also very large offsets can be compensated for and there is no need for a DC-free preamble. By exploiting the fact that the maximum deviation from the actual DC level is known (since modulation of the system is known), the DC-estimate is set. Once the preamble has been identified by the baseband processing, a control signal is sent to the circuit for DC-compensation which turns off the non-linear processing. During the rest of the packet, the DC-level is estimated by means pf low-pass filtering of the signal. Since the data is assumed to be whitened, and therefore can be expected to have almost zero mean, this will result in a smooth DC-estimate which is able to track DC-variations in the packet which are due to, for instance, frequency drift.

It is emphasised that the term "comprises" or "comprising" is used in this specification to specify the presence of stated features, integers, steps or components, but does not preclude the addition of one or more further features, integers, steps or components, or groups thereof.

According to one aspect of the present invention, there is provided a method of estimating a DC offset level of an input signal having a preamble part and a data part, the method comprising:

during reception of a preamble part of an input signal, using an estimation method which does not rely on a DC-free signal to estimate the DC offset value of the input signal; and during reception of a data part of the input signal, which data part follows the preamble part of the signal, using an estimation method which relies on a DC-free signal to estimate the DC offset value of the input signal.

DETAILED DESCRIPTION OF THE PREFERRED EMBODIMENT

Figure 1:
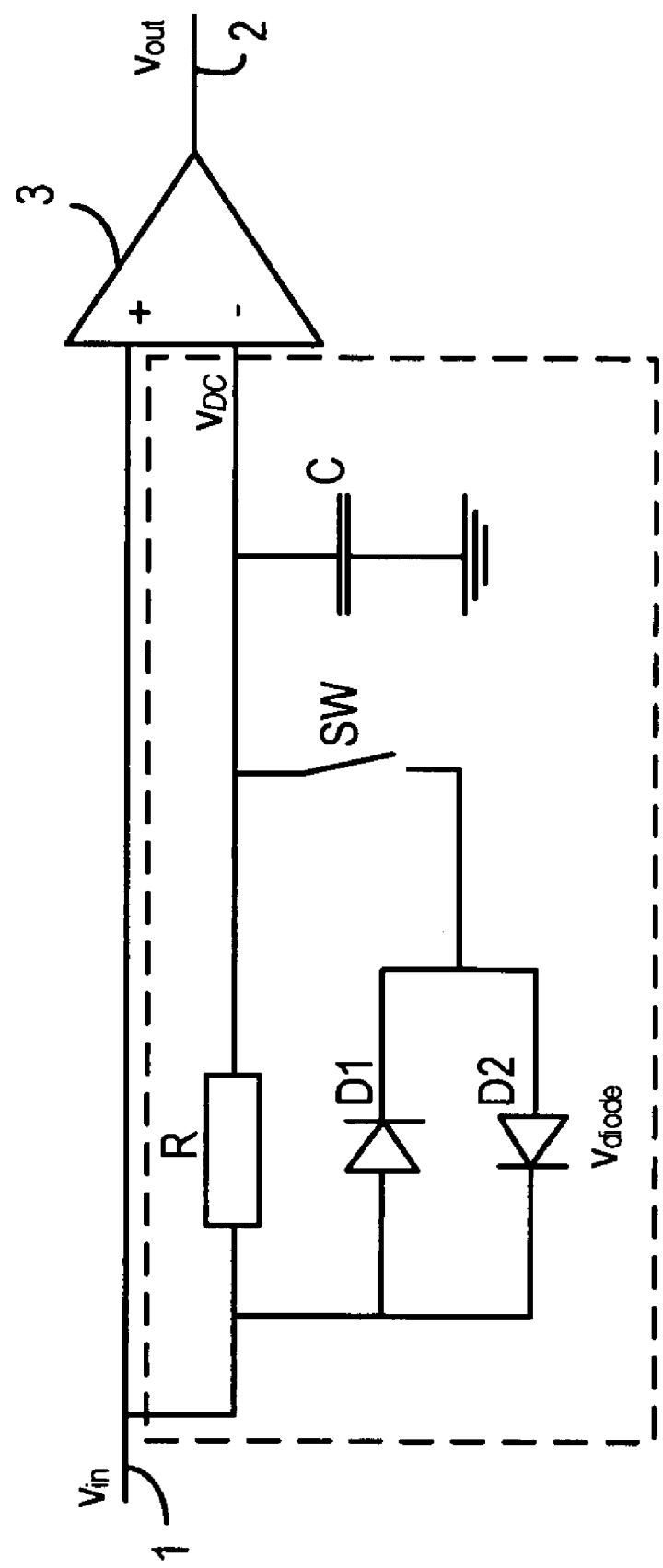
FIG. 1 illustrates one embodiment of the present invention

In the following, in order to ease the description, the principal behaviour is described when binary frequency modulation is used. However, it should be clear that the method is applicable whenever the decision making, hard or soft, requires that some reference level/threshold is established. It will also be readily appreciated that the method is not limited to binary modulation, but can be applied to non-binary modulation.

A circuit embodying one aspect of the present invention used for DC estimation is shown in FIG. 1. The circuit of FIG. 1 includes an input terminal 1 ($v_{IN}$), and an output terminal 2 ($v_{out}$). An amplifier 3 has one (+) of its two inputs connected to the input terminal 1, and has an output connected to the output terminal 2. A DC estimation circuit 4 is connected between the input terminal 1 and a second (−) input of the amplifier 3. As is well known, the amplifier 3 acts to output a signal which amplifies the difference between the two inputs (+, −) to the amplifier 3.

The DC estimation circuit 4 comprises a resistor R connected between the input terminal 1 and the second input (−) of the amplifier 3. A capacitor C is connected between ground and the second input (−) of the amplifier 3. A pair of diodes D1 and D2 is connected in parallel with the resistor R. The diode D1 is connected in forward bias from the input terminal 1 to a first terminal of a switch SW. That is, the anode of D1 is connected to the input terminal and the cathode of D1 is connected to the switch SW. The diode D2 is connected in reverse bias from the input terminal 1 to the first terminal of the switch SW. That is the cathode of D2 is connected to the input terminal 1 and the anode of D2 is connected to the switch SW. The second terminal of the switch SW is connected to the second input of the amplifier 3. Such an arrangement allows the diodes D1, D2 to be switched in and out of the circuit 4.

The diodes are not necessarily standard components, but rather they are preferably custom-built devices with the property that they behave in a similar way to diodes. More precisely, a diode can be understood to be a nonlinear device where the relation between the voltage drop (v_d) over the diode and the current (i) passing through it as follows $i=0$ if $v\_d<v\_diod$ and $v\_d=v\_diod$ if $i>0$ v_diod is a design parameter (rather than a fixed constant which is usually the case for standard components.

The output $V_{DC}$ of the estimation circuit 4 provides an estimate of the DC level of the signal provided to the input terminal 1.

The voltage drop over the diodes D1, D2 when they are leading (forward biassed), is $v_{diod}$, and this is set to correspond to the maximum frequency deviation of the received signal. For example, if the maximum frequency deviation is 100 kHz and the output voltage from the detector is 1 mV/kHz, $v_{diod}$ is set to 100 mV. Assuming that there is a frequency offset of +200 kHz, and that initially vDC=0, this has the following effect. $v_{DC}$ will instantaneously be set to the voltage corresponding to the instantaneous frequency deviation minus the voltage drop over the diodes. This means that once the input signal has its maximum frequency deviation, the corresponding voltage, in this example, is 200+100 mV (offset+frequency deviation), and therefore $v_{DC}$=200 mV ($v_{in}$−voltage drop over the diodes), which exactly corresponds to the true frequency offset. Note that if the time constant is very large, $v_{DC}$ would remain at this level throughout the packet, since the output signal from the detector will be in the range 100–300 mV, and as consequence, the diodes will not be on.

If the output voltage, in this example, from the detector due to noise is more than 300 mV, say 350 mV, then $v_{DC}$=250 mV. However, this will be adjusted as soon as the signal from the detector has its minimum value, since then the other of the diodes will be on and force $v_{DC}$ to be decreased. This is in sharp contrast to the max/min circuit estimation, where a too large estimate of the maximum would remain too large for a long time.

Now, since the preamble of the input signal is robust in the sense that it will be found even if some of the bits are in error, the primary concern is not a very accurate estimate but a very fast, although perhaps coarse, estimate, which is exactly what is achieved by the circuit of FIG. 1.

The preamble is the part of the packet which is sent before the data. The preamble can include, for example, such information as a syncword, and a small number of symbols intended for Dc estimation. The exact contents are of no importance, but the preamble should have the property that its presence can be detected, which typically means that it contains such a syncword.

It is critical that one can determine when the preamble ends and where the data begins. This is possible due to the presence of a syncword in the preamble and that once this is found one knows exactly when the preamble ends.

When the preamble is found, the switch SW is opened, and for the remaining part of the packet, i.e. for the actual data, $v_{DC}$ will be the low-pass (R-C) filtered version of the data. The choice of time constant will then depend upon factors such as how much frequency drift can be expected during a packet.

The invention claimed is:

1. A method of estimating a DC offset level of an input signal having a first part and a second part, the method comprising:
    during reception of a first part of an input signal, using an estimation method which does not rely on a DC-free signal to estimate the DC offset value of the input signal; and
    during reception of a second part of the input signal, using an estimation method which relies on a DC-free signal to estimate the DC offset value of the input signal.

2. A method of estimating a DC offset value of a frequency modulated input signal which comprises a first portion and a second portion, the method comprising:
    estimating a DC offset value of the first portion of the input signal using a resistance and first and second diodes connected in parallel; and
    estimating a DC offset value of the second part of the input signal using a low pass filter which includes the resistance.

3. A method as claimed in claim 2, wherein the voltage drop across each diode, when the diode is on, is set to equal the voltage deviation corresponding to a maximum frequency deviation of the input signal.

4. A circuit for estimating a DC offset value of an input signal comprising:
    input and output terminals;
    a low pass filter including a resistor and a capacitor, the resistor being connected between the input and output terminals and the capacitor being connected between the output terminal and ground;
    a pair of diodes operatively connected in parallel between the input and output terminals of the circuit; and
    switch means operable to switch a connection to the output terminal, such that the pair of diodes is connected to the output terminal during receipt of a first part of an input signal, and is not connected to the output terminal during receipt of a second part of the input signal.

* * * * *